(12) United States Patent
Zaidi

(10) Patent No.: US 7,718,464 B2
(45) Date of Patent: May 18, 2010

(54) INTEGRATED CIRCUIT FABRICATED USING AN OXIDIZED POLYSILICON MASK

(75) Inventor: Shoaib Zaidi, Mechanicsville, VA (US)

(73) Assignee: Qimonda North America Corp., Cary, NC (US)

( * ) Notice: Subject to any disclaimer, the term of this patent is extended or adjusted under 35 U.S.C. 154(b) by 203 days.

(21) Appl. No.: 12/038,846

(22) Filed: Feb. 28, 2008

(65) Prior Publication Data

US 2009/0218556 A1    Sep. 3, 2009

(51) Int. Cl.
  *H01L 21/00* (2006.01)
  *H01L 21/20* (2006.01)
  *H01L 29/00* (2006.01)
  *H01L 47/00* (2006.01)

(52) U.S. Cl. .................. 438/95; 438/102; 438/381; 257/1; 257/4; 257/5; 257/E21.068; 257/E21.09

(58) Field of Classification Search .................. 257/1, 257/4, 5, E21.068, E21.09; 438/95, 102, 438/381

See application file for complete search history.

(56) References Cited

U.S. PATENT DOCUMENTS

| 6,747,286 | B2 | 6/2004 | Lowrey |
| 6,774,388 | B2 | 8/2004 | Hudgens et al. |
| 6,891,747 | B2 | 5/2005 | Bez et al. |
| 6,961,258 | B2 | 11/2005 | Lowrey |
| 7,012,273 | B2 | 3/2006 | Chen |
| 2007/0155172 | A1* | 7/2007 | Lai et al. .................. 438/666 |
| 2009/0206315 | A1* | 8/2009 | Weis et al. .................. 257/4 |

OTHER PUBLICATIONS

"Novel Lithography-Independent Pore Phase Change Memory", M. Breitwisch, et al., Symposium on VLSI Technology, 2007 (2 pgs.).

* cited by examiner

*Primary Examiner*—Long K Tran
(74) *Attorney, Agent, or Firm*—Dicke, Billig & Czaja, PLLC

(57) ABSTRACT

An integrated circuit includes a first electrode, a second electrode, and dielectric material including an opening. The opening is defined by etching the dielectric material based on an oxidized polysilicon mask formed using a keyhole process. The integrated circuit includes resistivity changing material deposited in the opening and coupled between the first electrode and the second electrode.

12 Claims, 8 Drawing Sheets

INTEGRATED CIRCUIT FABRICATED USING AN OXIDIZED POLYSILICON MASK

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent or nearby the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material or to a resistive material adjacent or nearby the phase change material. The temperature in the phase change material in each memory cell generally corresponds to the applied level of current and/or voltage to achieve the heating. The power used to program a memory cell is affected by the electrical and thermal interface between the phase change material and at least one electrode contacting the phase change material.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

For these and other reasons, there is a need for the present invention.

SUMMARY

One embodiment provides an integrated circuit. The integrated circuit includes a first electrode, a second electrode, and dielectric material including an opening. The opening is defined by etching the dielectric material based on an oxidized polysilicon mask formed using a keyhole process. The integrated circuit includes resistivity changing material deposited in the opening and coupled between the first electrode and the second electrode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
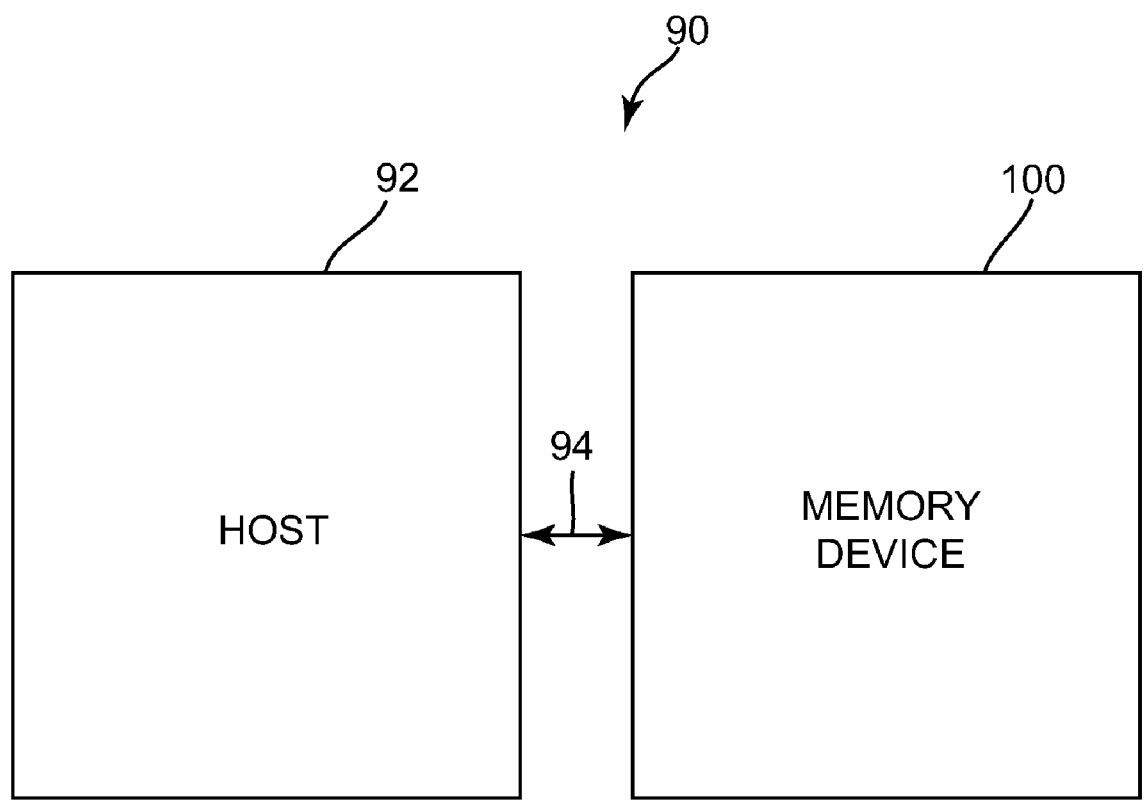
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
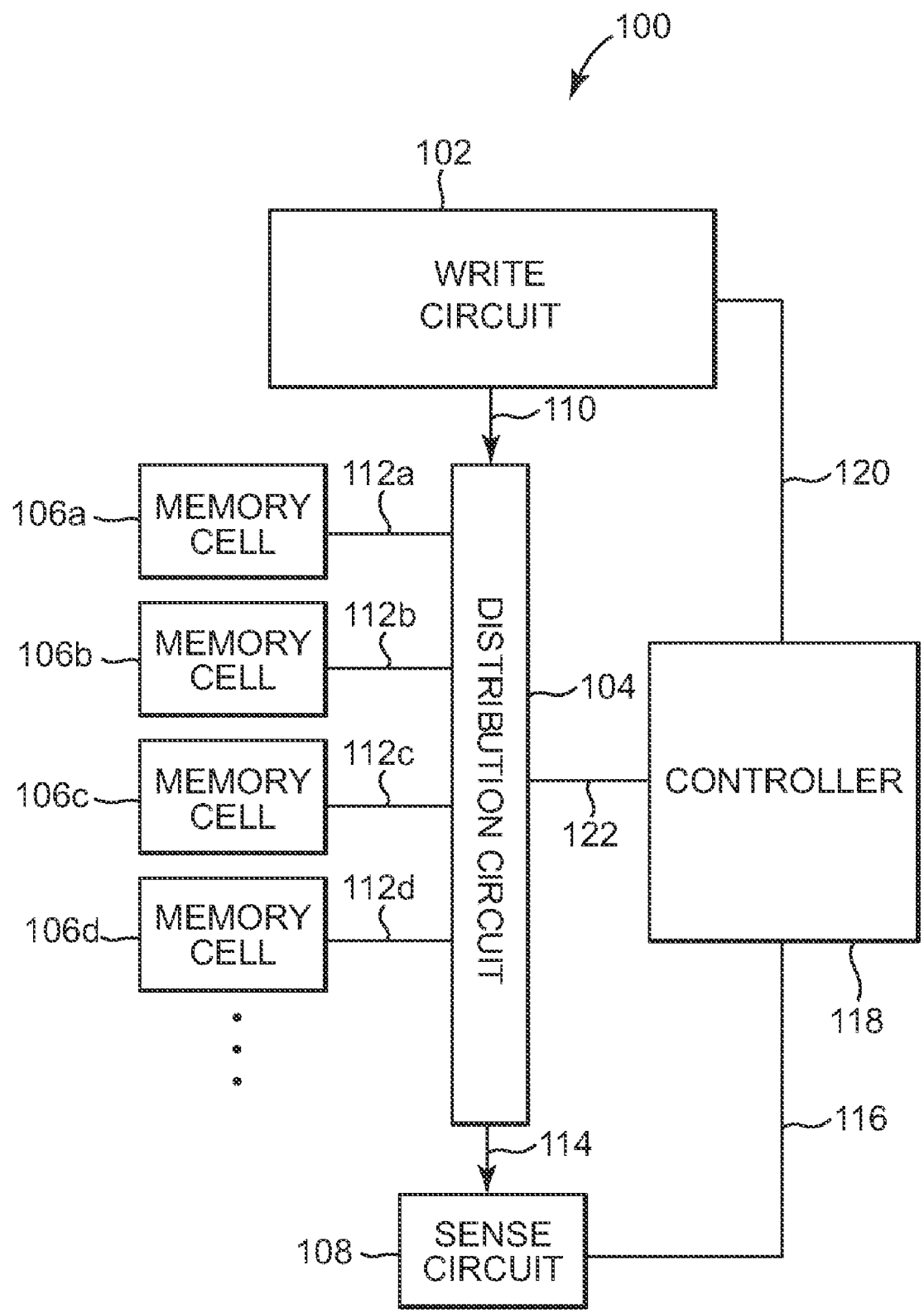
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d is fabricated by depositing phase change material into a pore defined in a dielectric material layer. The phase change material contacts a bottom electrode and a top electrode. The pore is formed using a keyhole process in which a polysilicon layer including a keyhole is etched to expose a portion of the dielectric material layer. The etched polysilicon is oxidized to provide an oxidized polysilicon mask for etching the dielectric material layer. The exposed portion of the dielectric material layer is then etched to provide the pore.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset. Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 3:
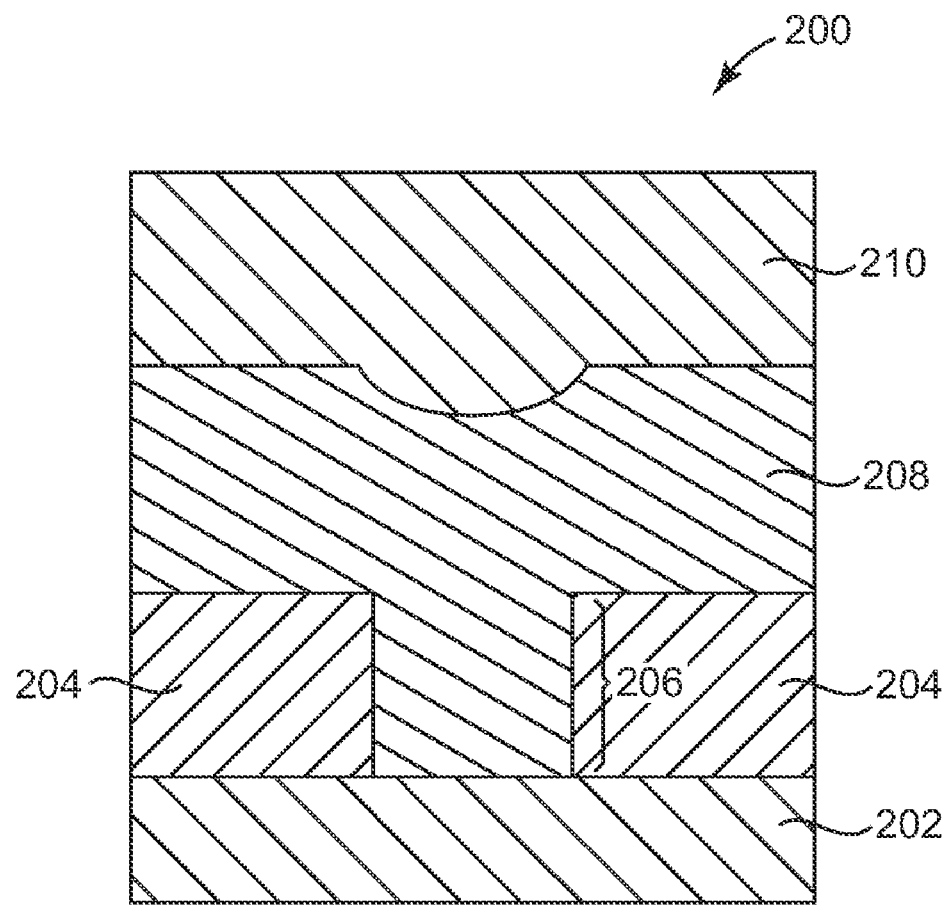
FIG. 3 illustrates a cross-sectional view of one embodiment of a phase change memory cell.

FIG. 3 illustrates a cross-sectional view of one embodiment of a phase change memory cell 200. In one embodiment, each of the phase change memory cells 106a-106d is similar to phase change memory cell 200. Phase change memory cell 200 includes a first electrode 202, a dielectric material layer 204, a phase change material 208, and a second electrode 210. First electrode 202 contacts dielectric material layer 204 and phase change material 208. Phase change material 208 contacts second electrode 210. Dielectric material layer 204 defines an opening or pore 206 into which phase change material 208 is deposited. In one embodiment, pore 206 has vertical sidewalls. In another embodiment, pore 206 has tapered sidewalls. In one embodiment, pore 206 has a sublithographic cross-section.

First electrode 202 and second electrode 210 include any suitable electrode material, such as TiN, TaN, W, Al, Ti, Ta, TiSiN, TaSiN, TiAlN, TaAlN, WN, C, or Cu. Dielectric material layer 204 includes any suitable dielectric material, such as SiN.

Phase change material 208 may be made up of a variety of materials in accordance with the present invention. Generally, chalcogenide alloys that contain one or more elements from group VI of the periodic table are useful as such materials. In one embodiment, phase change material 208 of phase change memory cell 200 is made up of a chalcogenide compound material, such as GeSbTe, SbTe, GeTe, or AgInSbTe. In another embodiment, phase change material 208 is chalcogen free, such as GeSb, GaSb, InSb, or GeGaInSb. In other embodiments, phase change material 208 is made up of any suitable material including one or more of the elements Ge, Sb, Te, Ga, As, In, Se, and S.

Phase change material 208 provides a storage location for storing one or more bits of data. During operation of memory cell 200, current or voltage pulses are applied between first electrode 202 and second electrode 210 to program the memory cell. During a set operation of memory cell 200, one or more set current or voltage pulses are selectively enabled by write circuit 102 and sent to first electrode 202 or second electrode 210. From first electrode 202 or second electrode 210, the set current or voltage pulses pass through phase change material 208 thereby heating the phase change material above its crystallization temperature (but usually below its melting temperature). In this way, the phase change material reaches a crystalline state or a partially crystalline and partially amorphous state during the set operation.

During a reset operation of memory cell 200, a reset current or voltage pulse is selectively enabled by write circuit 102 and sent to first electrode 202 or second electrode 210. From first electrode 202 or second electrode 210, the reset current or voltage pulse passes through phase change material 208. The reset current or voltage quickly heats the phase change material above its melting temperature. After the current or voltage pulse is turned off, the phase change material quickly quench cools into an amorphous state or a partially amorphous and partially crystalline state.

The following FIGS. 4-13 illustrate embodiments of a process for fabricating a phase change memory cell, such as phase change memory cell 200 previously described and illustrated with reference to FIG. 3.

Figure 4:
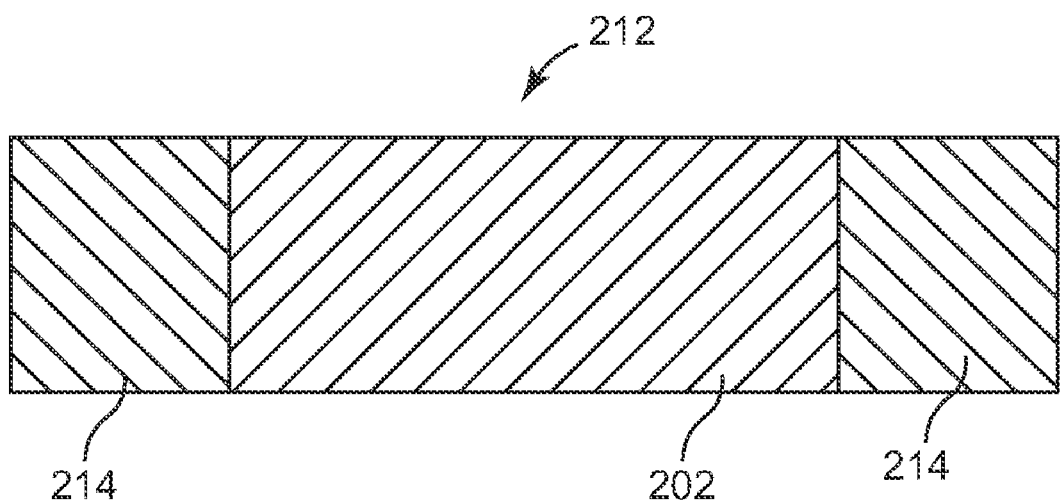
FIG. 4 illustrates a cross-sectional view of one embodiment of a preprocessed wafer.

FIG. 4 illustrates a cross-sectional view of one embodiment of a preprocessed wafer 212. Preprocessed wafer 212 includes a dielectric material 214, a first electrode 202, and lower wafer layers (not shown). Dielectric material 214 includes $SiO_2$, $SiO_x$, SiN, fluorinated silica glass (FSG), boro-phosphorus silicate glass (BPSG), boro-silicate glass (BSG), or other suitable dielectric material. First electrode 202 includes TiN, TaN, W, Al, Ti, Ta, TiSiN, TaSiN, TiAlN, TaAlN, WN, C, Cu, or other suitable electrode material. Dielectric material 214 laterally surrounds first electrode 202 and isolates first electrode 202 from adjacent device features.

Figure 5:
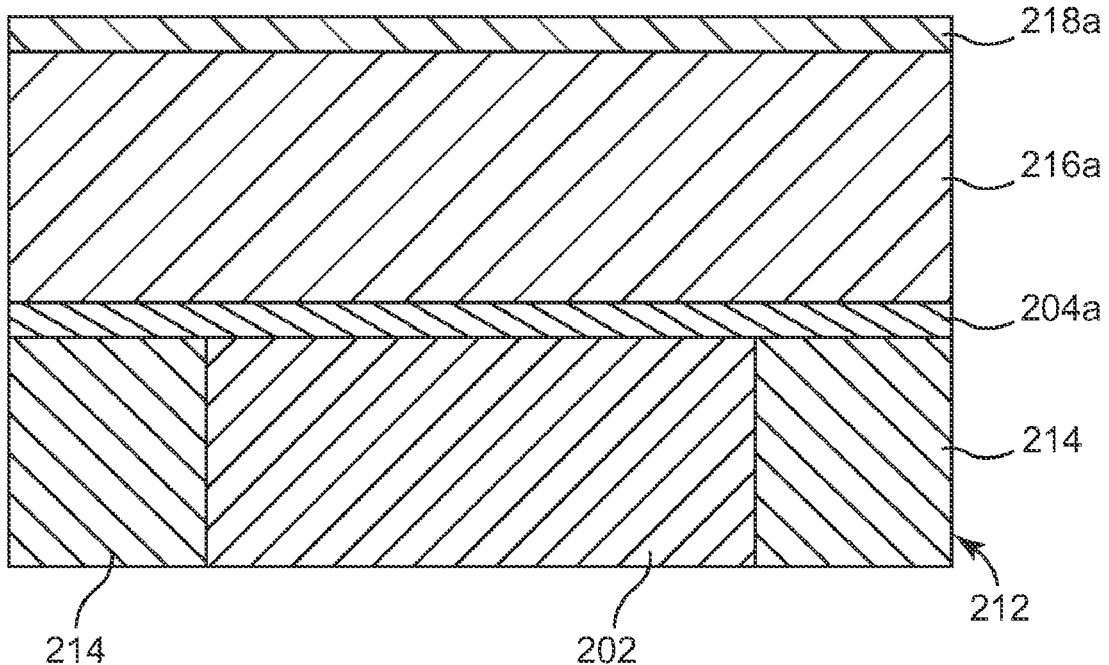
FIG. 5 illustrates a cross-sectional view of one embodiment of the preprocessed wafer, a first dielectric material layer, a second dielectric material layer, and a third dielectric material layer.

FIG. 5 illustrates a cross-sectional view of one embodiment of preprocessed wafer 212, a first dielectric material layer 204a, a second dielectric material layer 216a, and a third dielectric material layer 218a. A dielectric material, such as SiN or another suitable dielectric material is deposited over preprocessed wafer 212 to provide first dielectric material layer 204a. First dielectric material layer 204a is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique.

A second dielectric material different than the dielectric material of first dielectric material layer 204a, such as $SiO_2$ or other suitable material is deposited over first dielectric material layer 204a to provide second dielectric material layer 216a. Second dielectric material layer 216a is thicker than first dielectric material layer 204a. In one embodiment, second dielectric material layer 216a is at least four times thicker than first dielectric material layer 204a. Dielectric material layer 216a is deposited using CVD, HDP-CVD, ALD, MOCVD, PVD, JVD, or other suitable deposition technique.

A third dielectric material similar to the dielectric material of dielectric material layer 204a, such as SiN or another suitable dielectric material is deposited over second dielectric material layer 216a to provide third dielectric material layer 218a. Third dielectric material layer 218a is thinner than second dielectric material layer 216a. In one embodiment, third dielectric material layer 218a has substantially the same thickness as first dielectric material layer 204a. Third dielectric material layer 218a is deposited using CVD, HDP-CVD, ALD, MOCVD, PVD, JVD, or other suitable deposition technique.

Figure 6:
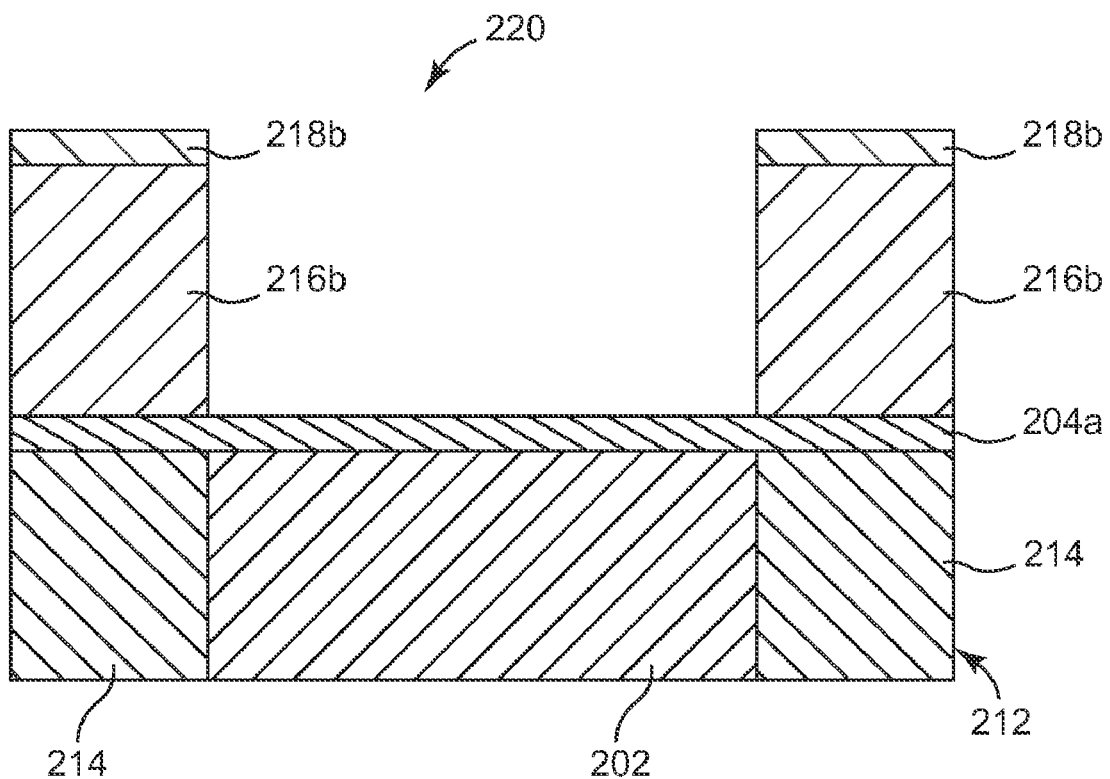
FIG. 6 illustrates a cross-sectional view of one embodiment of the preprocessed wafer, the first dielectric material layer, the second dielectric material layer, and the third dielectric material layer after etching the third dielectric material layer and the second dielectric material layer.

FIG. 6 illustrates a cross-sectional view of one embodiment of preprocessed wafer 212, first dielectric material layer 204a, second dielectric material layer 216b, and third dielectric material layer 218b after etching third dielectric material layer 218a and second dielectric material layer 216a. Third dielectric material layer 218a and second dielectric material layer 216a are etched to provide opening 220 exposing first dielectric material layer 204a and to provide second dielectric material layer 216b and third dielectric material layer 218b. In one embodiment, opening 220 is substantially centered over first electrode 202.

Figure 7:
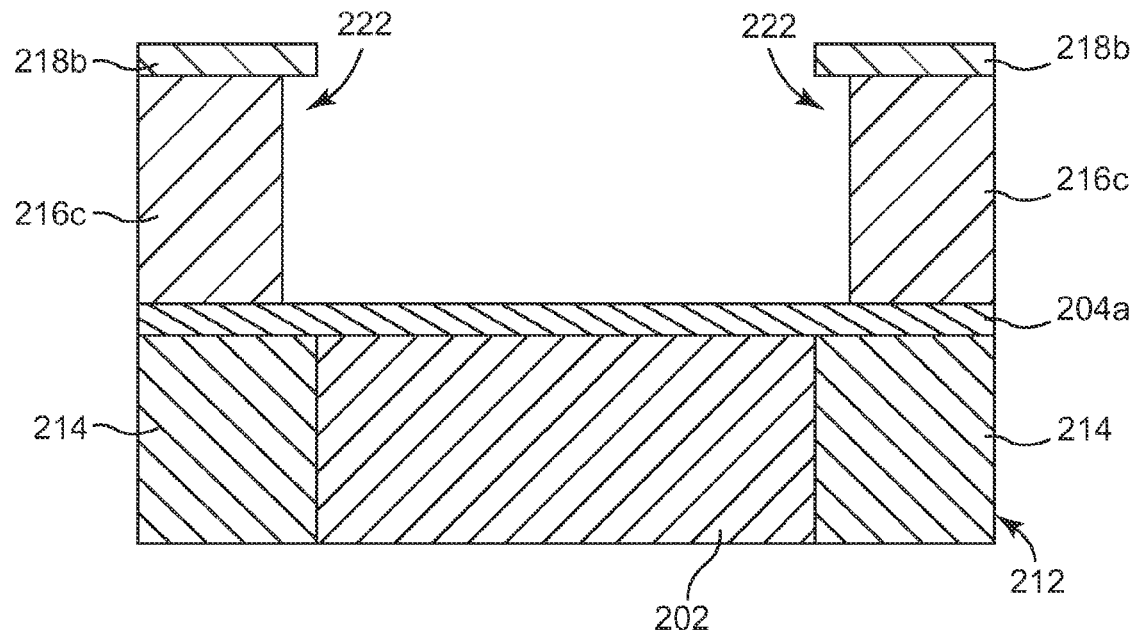
FIG. 7 illustrates a cross-sectional view of one embodiment of the preprocessed wafer, the first dielectric material layer, the second dielectric material layer, and the third dielectric material layer after etching the second dielectric material layer.

FIG. 7 illustrates a cross-sectional view of one embodiment of preprocessed wafer 212, first dielectric material layer 204a, second dielectric material layer 216c, and third dielectric material layer 218b after etching second dielectric material layer 216b. Second dielectric material layer 216b is selectively recess etched using a selective wet etch or other suitable etch to create overhang of third dielectric material layer 218b as indicated at 222.

Figure 8:
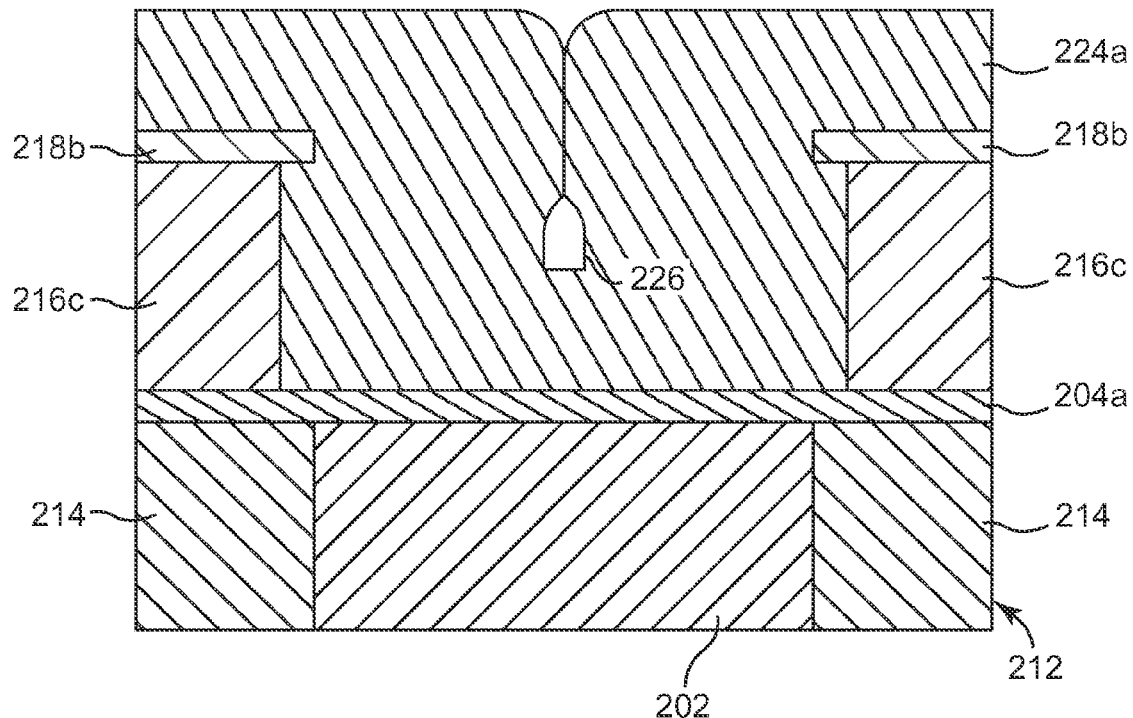
FIG. 8 illustrates a cross-sectional view of one embodiment of the preprocessed wafer, the first dielectric material layer, the second dielectric material layer, the third dielectric material layer, and a keyhole formed in a polysilicon layer.

FIG. 8 illustrates a cross-sectional view of one embodiment of preprocessed wafer 212, first dielectric material layer 204a, second dielectric material layer 216c, third dielectric material layer 218b, and a keyhole 226 formed in a polysilicon layer 224a. Polysilicon or another suitable material is conformally deposited over exposed portions of third dielectric material layer 218b, second dielectric material layer 216c, and first dielectric material layer 204a. Due to overhang 222, the conformal deposition of polysilicon pinches itself off forming a void or keyhole 226. Keyhole 226 is substantially centered over first electrode 202. Polysilicon layer 224a is deposited using CVD, HDP-CVD, ALD, MOCVD, PVD, JVD, or other suitable deposition technique.

Figure 9:
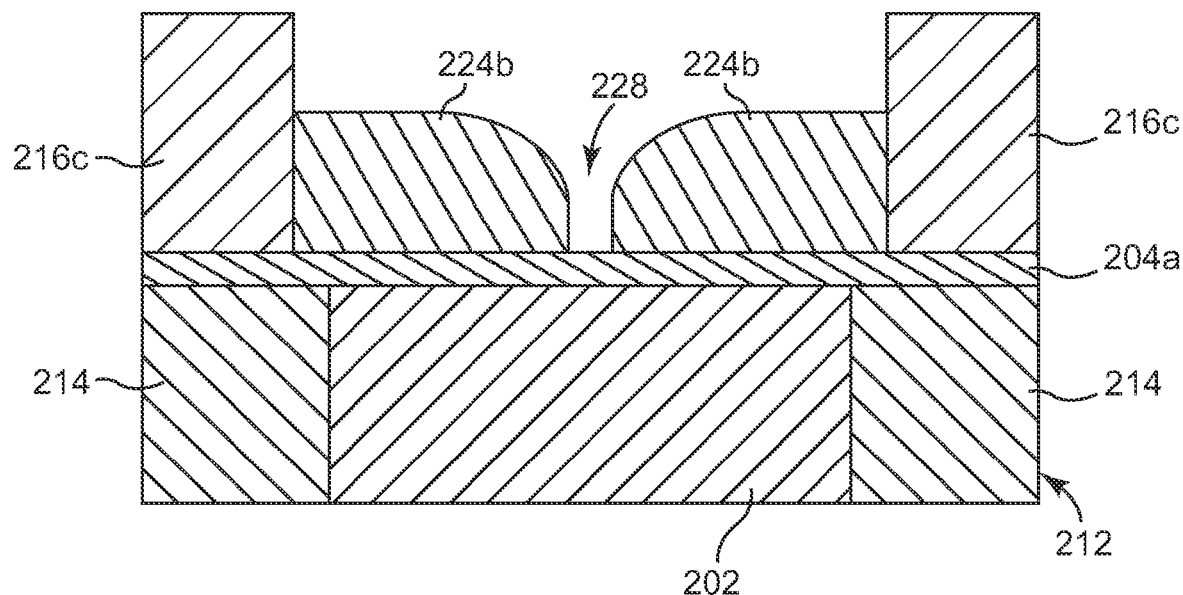
FIG. 9 illustrates a cross-sectional view of one embodiment of the preprocessed wafer, the first dielectric material layer, the second dielectric material layer, and the polysilicon layer after etching the polysilicon layer.

FIG. 9 illustrates a cross-sectional view of one embodiment of preprocessed wafer 212, first dielectric material layer 204a, second dielectric material layer 216c, and polysilicon layer 224b after etching polysilicon layer 224a and third dielectric material layer 218b. Polysilicon layer 224a is etched to expose keyhole 226. The polysilicon layer continues to be etched to provide opening or pore 228 exposing first dielectric material layer 204a and to provide polysilicon layer 224b. In one embodiment, opening or pore 228 has a sublithographic cross-section such that the exposed portion of first dielectric material layer 204a has a sublithographic cross-section. Third dielectric material layer 218b is removed.

Figure 10:
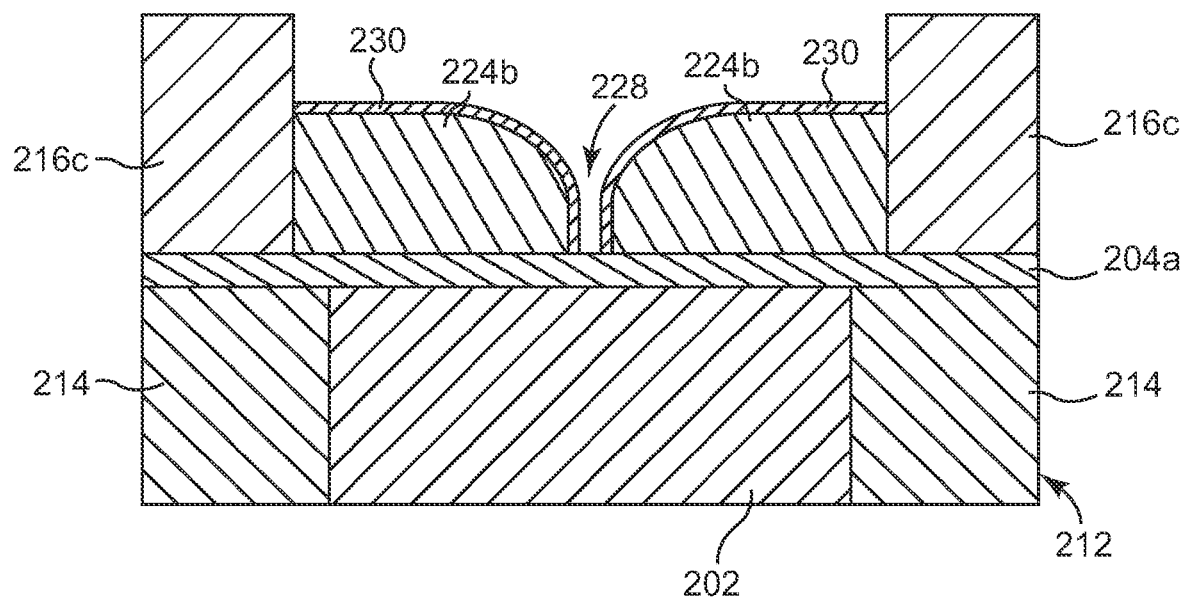
FIG. 10 illustrates a cross-sectional view of one embodiment of the preprocessed wafer, the first dielectric material layer, the second dielectric material layer, the polysilicon layer, and an oxide layer after oxidizing the polysilicon layer.

FIG. 10 illustrates a cross-sectional view of one embodiment of preprocessed wafer 212, first dielectric material layer 204a, second dielectric material layer 216c, polysilicon layer 224b, and an oxide layer 230 after oxidizing polysilicon layer 224b. Polysilicon layer 224b is oxidized using a low temperature oxidation process or other suitable process to provide oxide layer 230. Oxide layer 230 reduces the critical dimension (CD) or cross-section of pore 228. In addition, when compared to polysilicon layer 224b, oxide layer 230 has improved selectivity to dielectric material layer 204a during etching. The improved selectivity enables a better profile to be maintained when first dielectric material layer 204a is etched using polysilicon layer 224b and oxide layer 230 as a mask.

Figure 11:
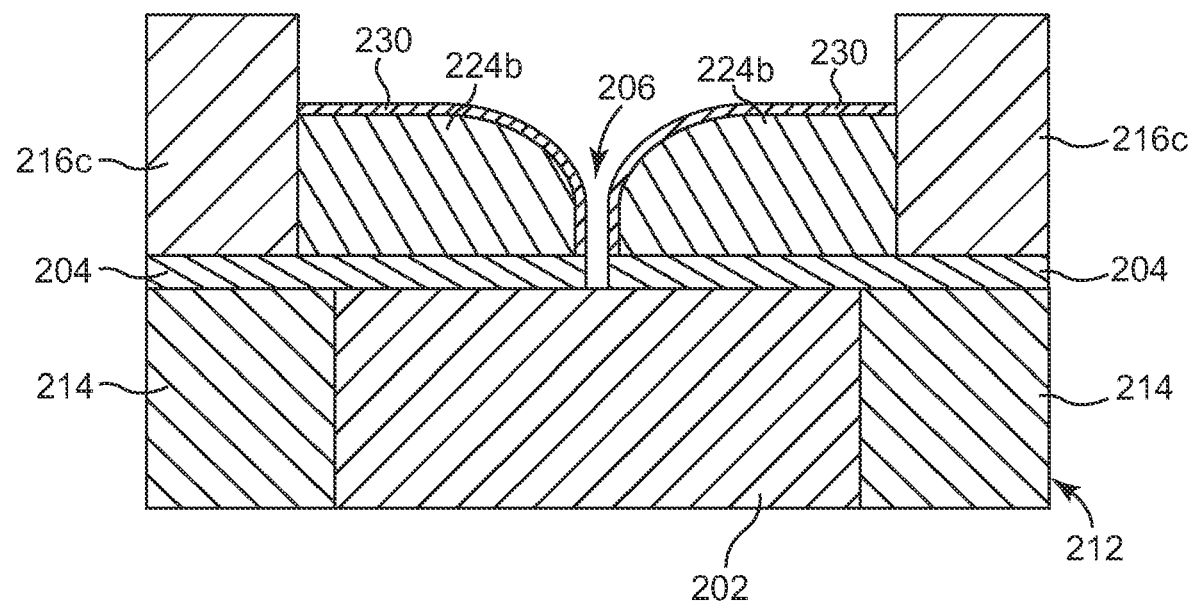
FIG. 11 illustrates a cross-sectional view of one embodiment of the preprocessed wafer, the first dielectric material layer, the second dielectric material layer, the polysilicon layer, and the oxide layer after etching the first dielectric material layer.

FIG. 11 illustrates a cross-sectional view of one embodiment of preprocessed wafer 212, first dielectric material layer 204, second dielectric material layer 216c, polysilicon layer 224b, and oxide layer 230 after etching first dielectric material layer 204a. The exposed portion of first dielectric material layer 204a is etched to provide opening or pore 206 exposing first electrode 202 and to provide first dielectric material layer 204. In one embodiment, pore 206 has vertical sidewalls. In another embodiment, pore 206 has tapered sidewalls. In one embodiment, the tapered sidewalls are less tapered than can be achieved by using polysilicon layer 224b as the mask without oxide layer 230.

Figure 12:
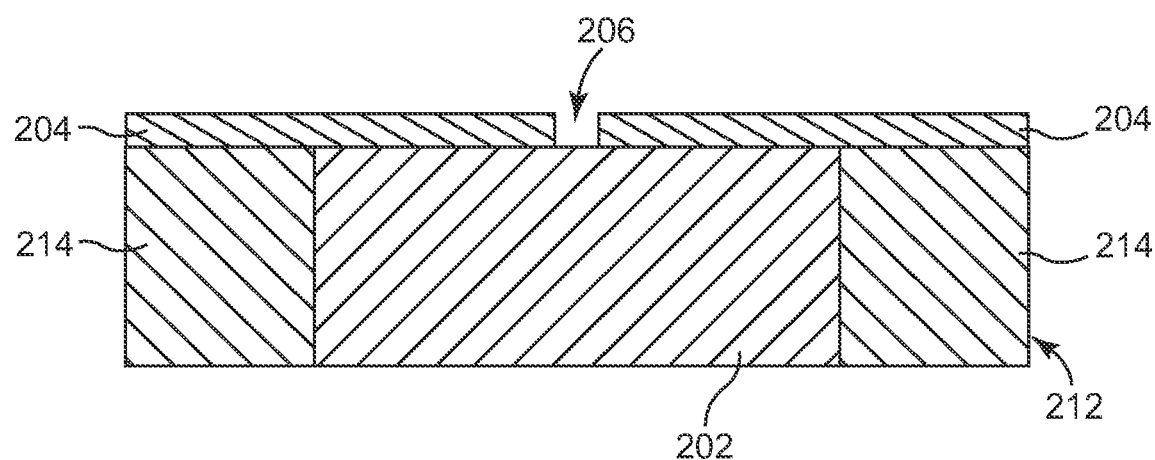
FIG. 12 illustrates a cross-sectional view of one embodiment of the preprocessed wafer and the first dielectric material layer after removing the oxide layer, the polysilicon layer, and the second dielectric material layer.

FIG. 12 illustrates a cross-sectional view of one embodiment of preprocessed wafer 212 and first dielectric material layer 204 after removing oxide layer 230, polysilicon layer 224b, and second dielectric material layer 216c. Oxide layer 230, polysilicon layer 224b, and second dielectric material layer 216c are etched to expose first dielectric material layer 204.

Figure 13:
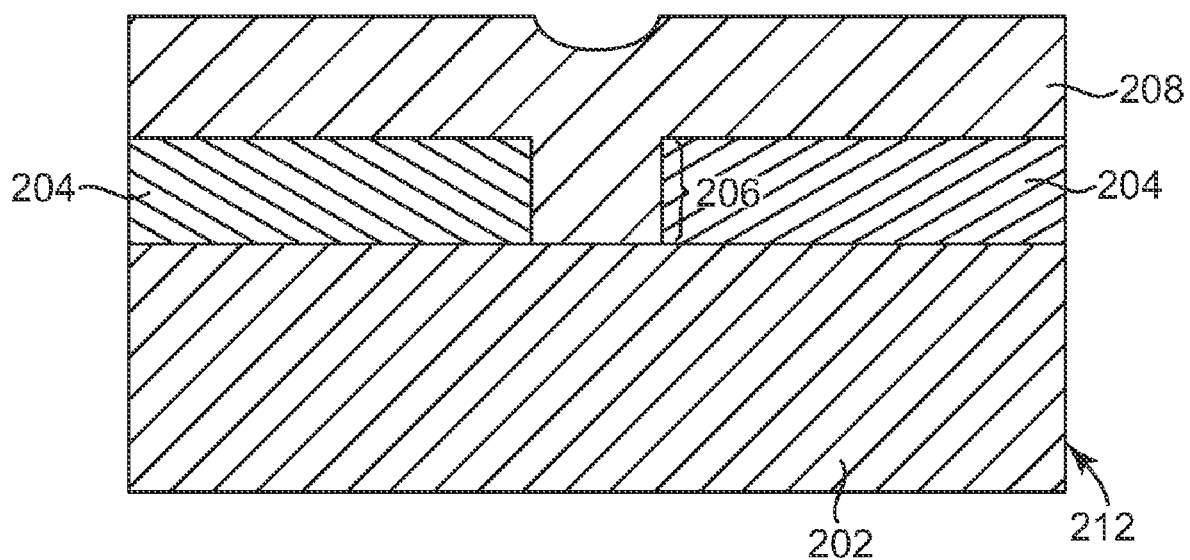
FIG. 13 illustrates a cross-sectional view of one embodiment of the preprocessed wafer, the first dielectric material layer, and a phase change material layer.

FIG. 13 illustrates a cross-sectional view of one embodiment of preprocessed wafer 212, first dielectric material layer 204, and a phase change material 208. A phase change material, such as a chalcogenide compound material or other suitable phase change material is deposited over exposed portions of dielectric material layer 204 and first electrode 202 to provide phase change material 208. Phase change material 208 is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, WN, C, Cu, or other suitable electrode material is deposited over phase change material 208 to provide second electrode 210 and phase change memory cell 200 as previously described and illustrated with reference to FIG. 3. The electrode material is deposited using CVD, HDP-CVD, ALD, MOCVD, PVD, JVD, or other suitable deposition technique.

Embodiments provide a phase change memory cell including phase change material deposited in a pore defined in a dielectric material layer. The pore is fabricated by forming an oxidized polysilicon mask over the dielectric material layer using a keyhole process. The exposed portion of the dielectric material layer is then etched to provide the pore. The oxide layer of the mask enables a better etch profile of the dielectric material layer to be maintained and reduces the critical dimension of the pore compared to a polysilicon mask without the oxide layer.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an integrated circuit, the method comprising:

providing a preprocessed wafer including a first electrode;

depositing a first dielectric material over the preprocessed wafer;

forming an oxidized polysilicon mask over the first dielectric material that exposes a portion of the first dielectric material;

etching the exposed portion of the first dielectric material to expose a portion of the first electrode;

removing the oxidized polysilicon mask;

depositing a resistivity changing material over the etched first dielectric material and the exposed portion of the first electrode; and fabricating a second electrode coupled to the resistivity changing material.

2. The method of claim 1, wherein forming the oxidized polysilicon mask comprises forming the oxidized polysilicon mask using a keyhole process.

3. The method of claim 1, wherein forming the oxidized polysilicon mask comprises forming an oxidized polysilicon mask that exposes a portion of the first dielectric material having a sublithographic cross-section.

4. The method of claim 1, wherein etching the exposed portion of the first dielectric material comprises etching the exposed portion of the first dielectric material to provide an opening having vertical sidewalls.

5. The method of claim 1, wherein depositing the resistivity changing material comprises depositing phase change material.

6. The method of claim 1, wherein depositing the first dielectric material comprises depositing SiN.

7. A method for fabricating a memory, the method comprising:

providing a preprocessed wafer including a first electrode;

depositing a first dielectric material layer over the preprocessed wafer;

depositing a second dielectric material layer over the first dielectric material layer;

depositing a third dielectric material layer over the second dielectric material layer;

etching the second and third dielectric material layers to provide an opening exposing a portion of the first dielectric material layer;

recess etching the etched second dielectric material layer to provide an overhang of the etched third dielectric material layer;

conformally depositing a polysilicon layer over exposed portions of the first dielectric material layer, the recess etched second dielectric material layer, and the etched third dielectric material layer to form a keyhole;

etching the polysilicon layer to expose a portion of the first dielectric material layer below the keyhole;

oxidizing the etched polysilicon layer;

etching the exposed portion of the first dielectric material layer to expose a portion of the first electrode;

removing the oxidized polysilicon layer, the recess etched second dielectric material layer, and the etched third dielectric material layer;

depositing a phase change material layer over the etched first dielectric material layer and the exposed portion of the first electrode; and fabricating a second electrode contacting the phase change material layer.

8. The method of claim 7, wherein oxidizing the etched polysilicon layer comprises using a low temperature oxidation process to oxidize the etched polysilicon layer.

9. The method of claim 7, wherein oxidizing the etched polysilicon layer comprises oxidizing the etched polysilicon layer to reduce a cross-section of the exposed portion of the first electrode.

10. The method of claim 7, wherein etching the polysilicon layer comprises etching the polysilicon layer to expose a portion of the first dielectric material layer having a sublithographic cross-section.

11. The method of claim 7, wherein etching the exposed portion of the first dielectric material layer comprises etching the exposed portion of the first dielectric material layer to provide a pore having vertical sidewalls.

12. The method of claim 7, wherein depositing the first dielectric material layer comprises depositing a SiN layer.

* * * * *